(12) United States Patent
Lee

(10) Patent No.: US 7,804,312 B2  
(45) Date of Patent: Sep. 28, 2010

(54) SILICON WAFER FOR PROBE BONDING AND PROBE BONDING METHOD USING THEREOF

(75) Inventor: Jung-Hoon Lee, Kunpo-shi (KR)

(73) Assignee: Phicom Corporation, Seoul (KR)

( * ) Notice: Subject to any disclaimer, the term of this patent is extended or adjusted under 35 U.S.C. 154(b) by 715 days.

(21) Appl. No.: 11/569,839

(22) PCT Filed: Jun. 14, 2005

(86) PCT No.: PCT/KR2005/001806

§ 371 (c)(1),  
(2), (4) Date: Nov. 30, 2006

(87) PCT Pub. No.: WO2005/122240

PCT Pub. Date: Dec. 22, 2005

(65) Prior Publication Data

US 2008/0012588 A1    Jan. 17, 2008

(30) Foreign Application Priority Data

Jun. 14, 2004   (KR) .................. 2004-0043676

(51) Int. Cl.  
G01R 31/02 (2006.01)

(52) U.S. Cl. .................................... 324/754

(58) Field of Classification Search ............. None  
See application file for complete search history.

(56) References Cited

U.S. PATENT DOCUMENTS

| | | |
|---|---|---|
| 5,718,040 A | 2/1998 | Faure et al. |
| 6,344,752 B1 | 2/2002 | Hagihara et al. |
| 6,520,778 B1 | 2/2003 | Eldridge et al. |
| 6,586,955 B2 * | 7/2003 | Fjelstad et al. ............ 324/754 |
| 2002/0000815 A1 * | 1/2002 | Fjelstad et al. ............ 324/754 |
| 2006/0169678 A1 * | 8/2006 | Lee et al. ............... 219/121.63 |

FOREIGN PATENT DOCUMENTS

| | | |
|---|---|---|
| JP | 2000-111576 | 4/2000 |
| JP | 2002-277485 | 9/2002 |
| JP | 2003-215161 | 7/2003 |
| WO | WO 2008147119 A1 * | 12/2008 |

OTHER PUBLICATIONS

T.W. Kenny et al, Micromachined silicon tunnel sensor for motion detection, Jan. 7, 1991, Applied Physics Letters, vol. 58 Iss. No. 1, pp. 100-102.*

PCT/KR2005/001806 International Search Report dated Aug. 19, 2005.

Japanese Office Action dated Nov. 10, 2009 for Japanese counterpart of Korean Patent Application No. 2007-527028, from which present U.S Application claims priority.

* cited by examiner

*Primary Examiner*—Jermele M Hollington  
(74) *Attorney, Agent, or Firm*—Daly, Crowley, Mofford & Durkee, LLP

(57) ABSTRACT

Disclosed herein are a silicon wafer for probe bonding and a probe bonding method using the same. The silicon wafer for probe bonding is improved in structure to facilitate probe bonding on a probe substrate. The probe bonding method involves bonding supporting beams on the silicon wafer to bumps on the probe substrate. The silicon wafer is formed at a surface thereof with probe tips and supporting beams on an end of each probe tip to have a redetermined arrangement pattern. The silicon wafer is further formed with openings from an upper surface to a lower surface thereof. A portion of each supporting beam opposite to the probe tips protrudes is exposed to the outside through the openings.

12 Claims, 6 Drawing Sheets

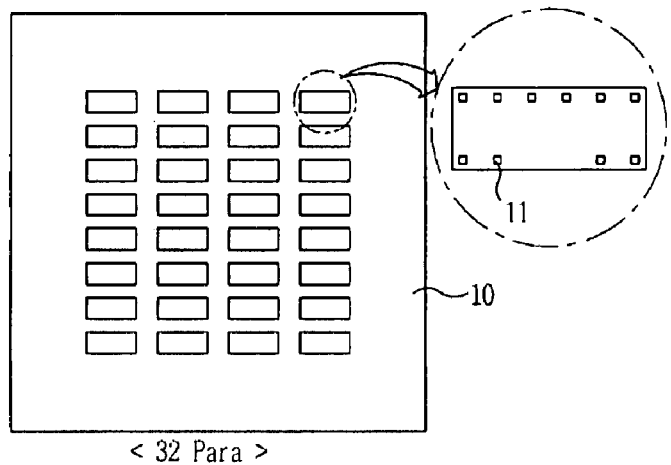
[Fig. 1]
< 32 Para >
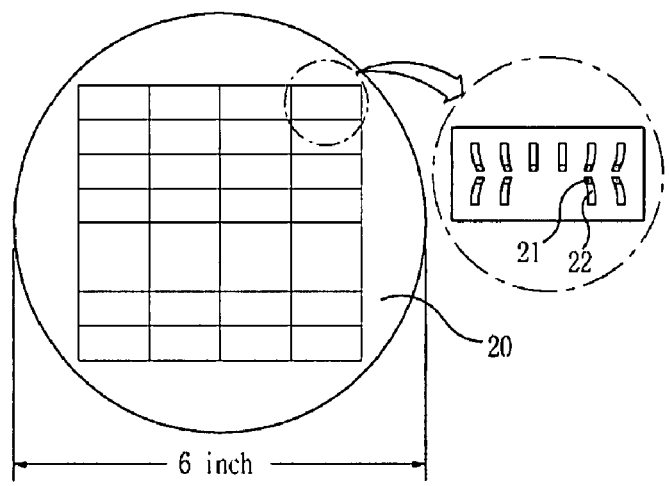
[Fig. 2]
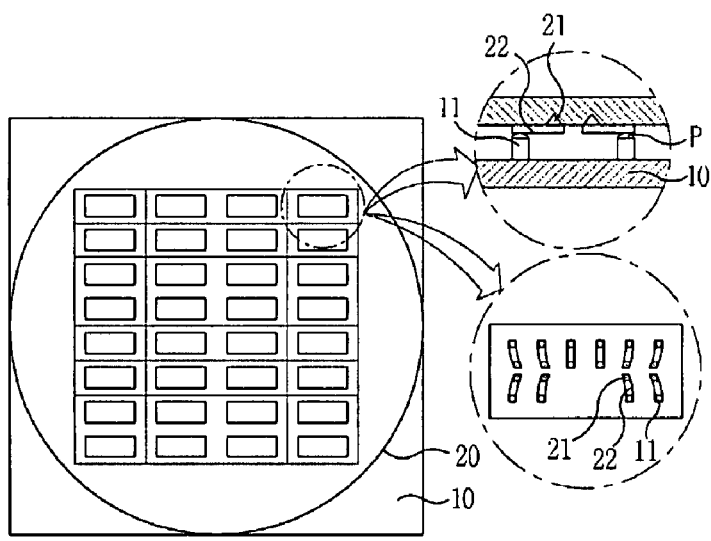
[Fig. 3]

[Fig. 4]
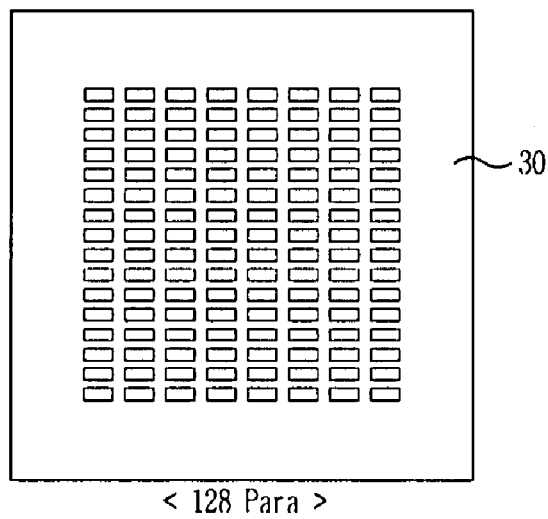
< 128 Para >
[Fig. 5]
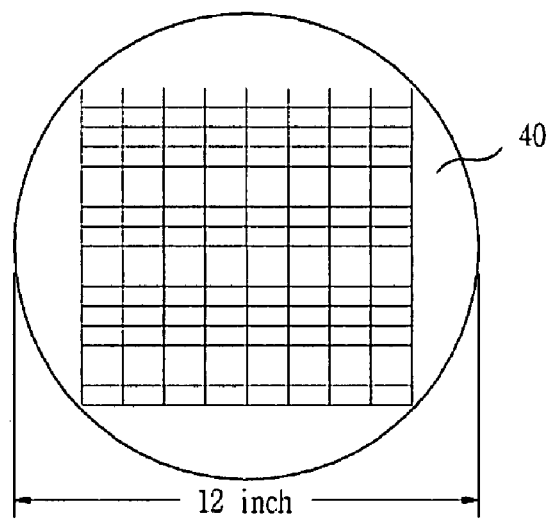
12 inch
[Fig. 6]
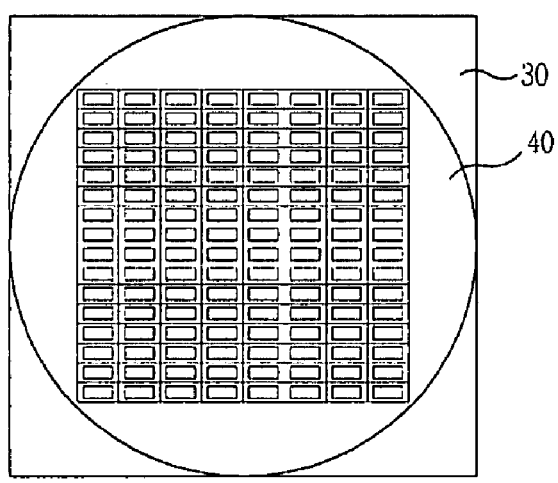

[Fig. 7]
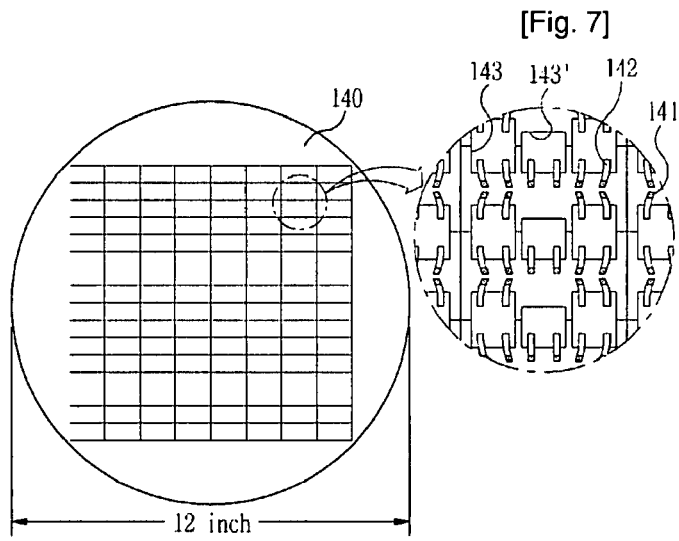
[Fig. 8]
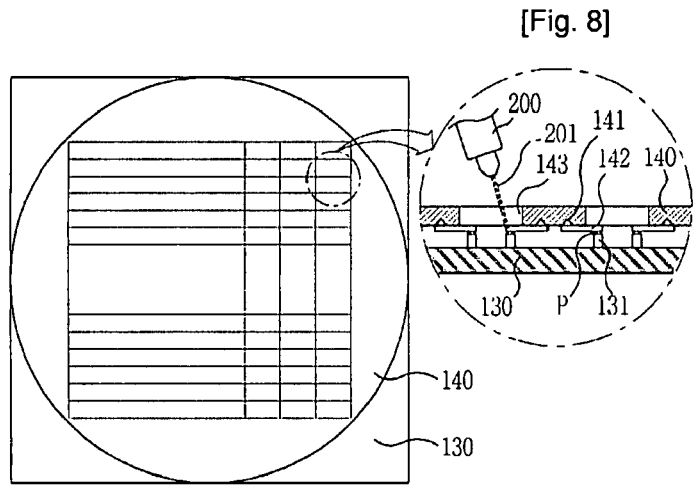
[Fig. 9]
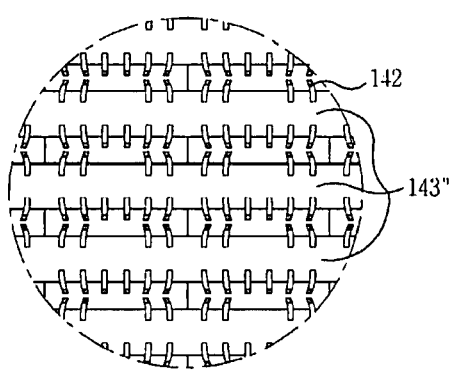
[Fig. 10]
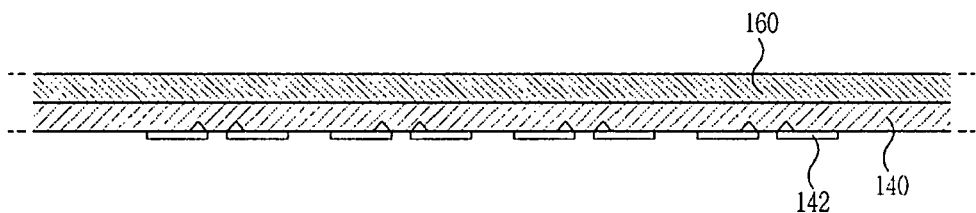

[Fig. 11]
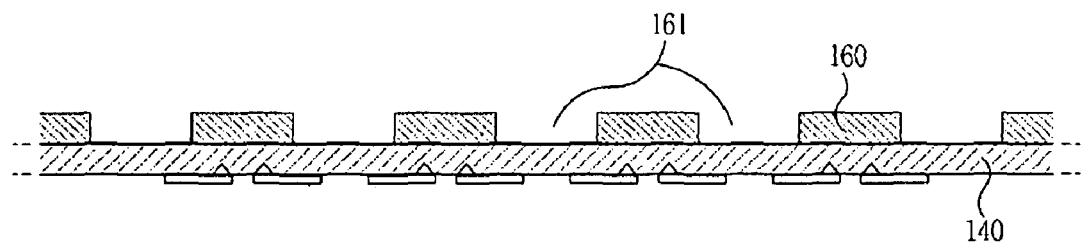
[Fig. 12]
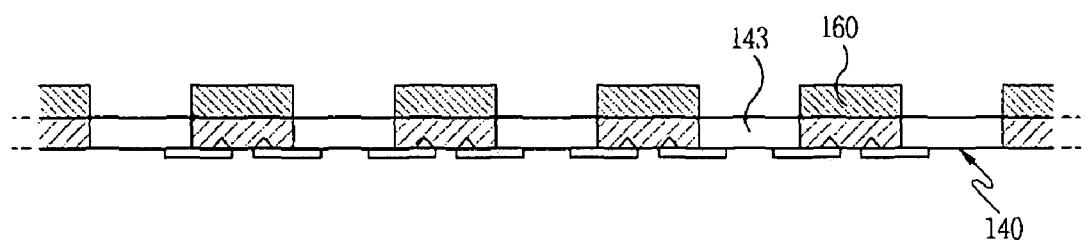
[Fig. 13]
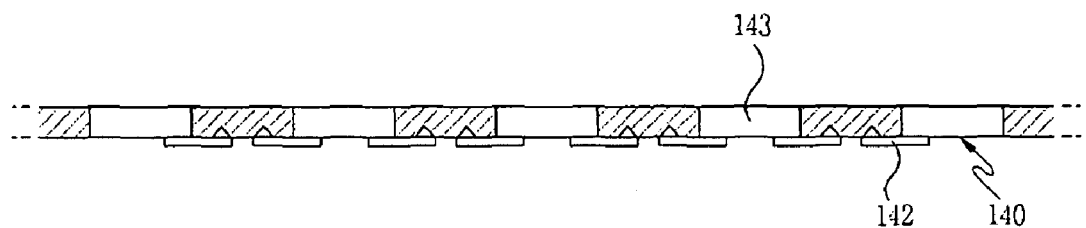
[Fig. 14]
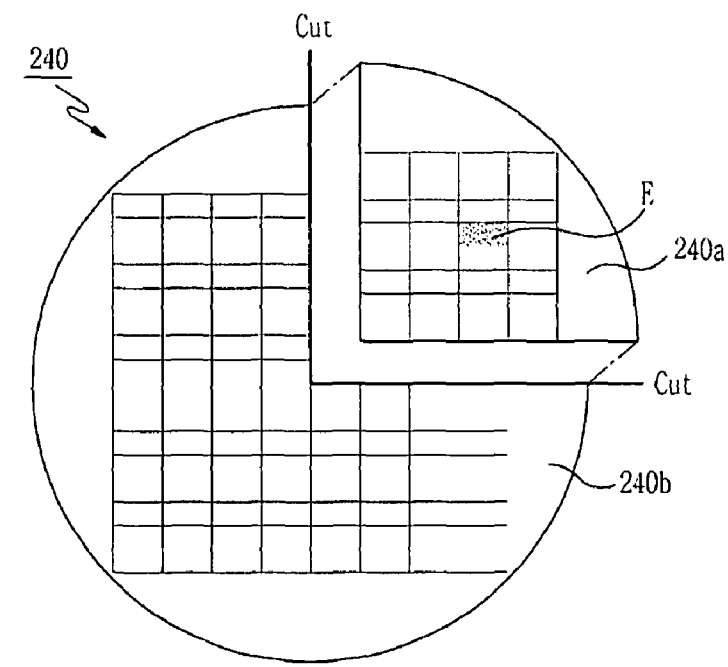

[Fig. 15]
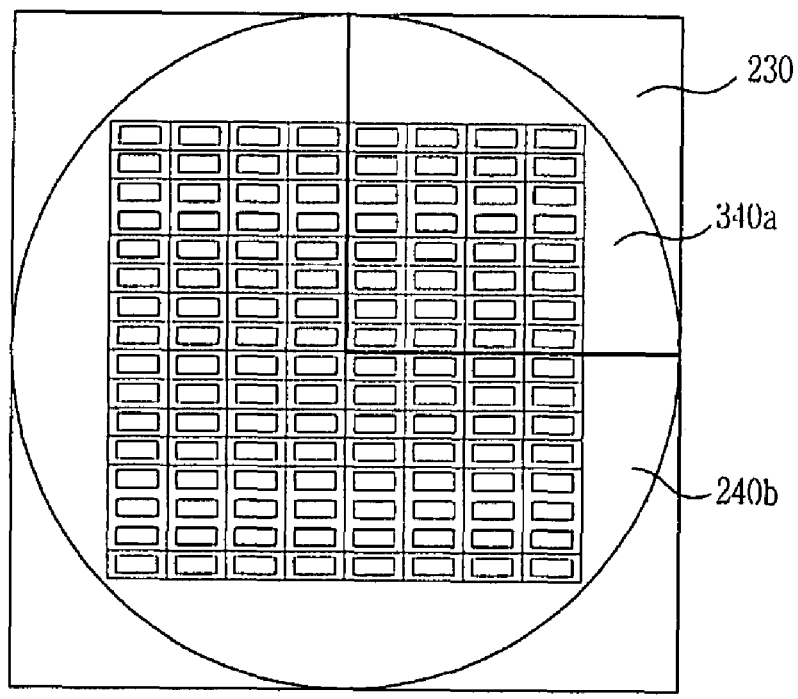
[Fig. 16]
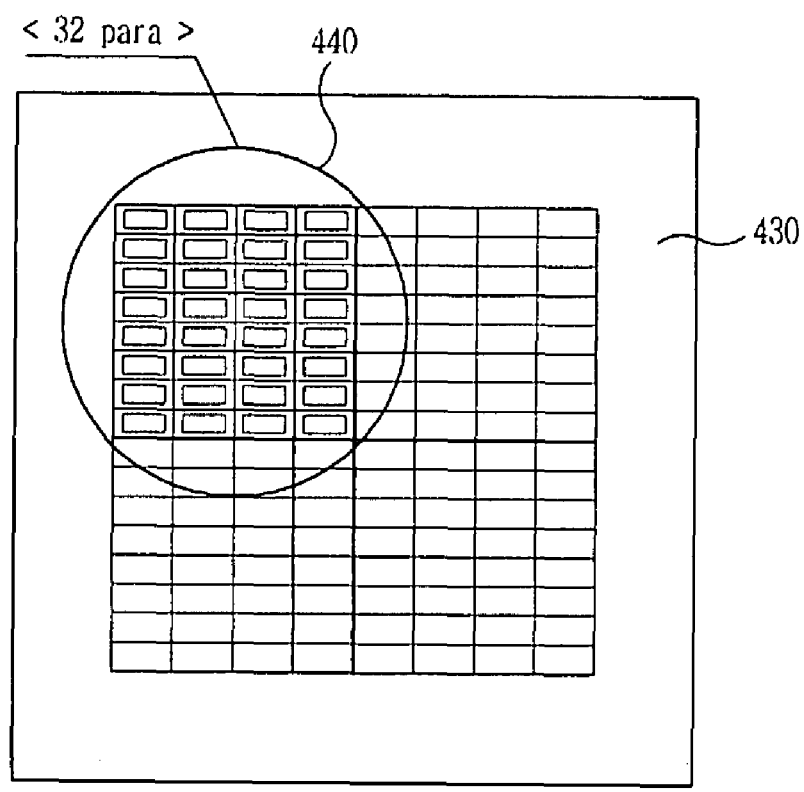

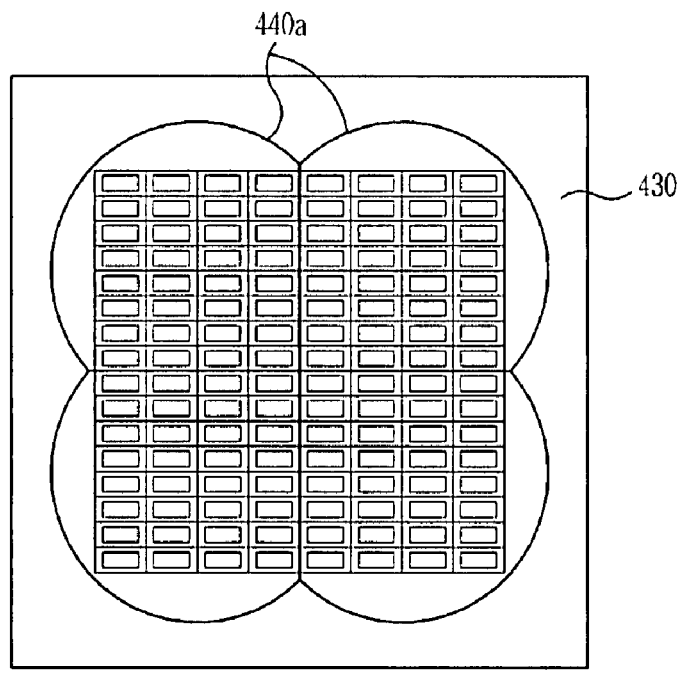
[Fig. 18]
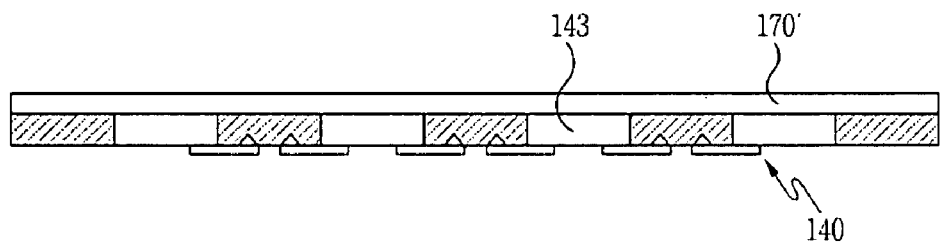
[Fig. 19]
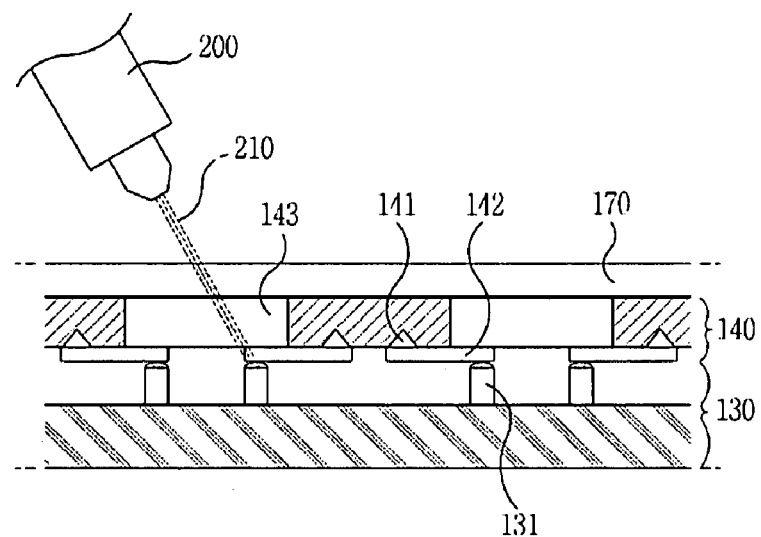

SILICON WAFER FOR PROBE BONDING AND PROBE BONDING METHOD USING THEREOF

CROSS REFERENCE TO RELATED APPLICATIONS

This application is a National Stage Application under 35 U.S.C. §371 of International Application number PCT/KR2005/001806 filed on Jun. 14, 2005, which was published in the English language on Dec. 22, 2005 as International Publication Number WO 2005/122240, and which claims the benefit under 35 U.S.C. §119(a) of Korean Patent Application 10-2004-0043676, filed Jun. 14, 2004.

TECHNICAL FIELD

The present invention relates to a silicon wafer for probe bonding and a probe bonding method using the same, and, more particularly, to a silicon wafer including probe tips and supporting beams formed at a surface thereof, which is improved in structure to facilitate probe bonding to a probe substrate, and a probe bonding method of bonding the supporting beams of the silicon wafer to bumps of the probe substrate.

BACKGROUND ART

Generally, semiconductor integrated circuit devices are tested to determine whether they have been manufactured to have electric properties satisfying a design standard, and test equipment thereof is probe equipment. A probe card, as an element of the probe equipment, is designed to come into contact with a pad provided in a semi-conductor integrated circuit device, thereby serving to electrically communicate various electric signal generators or signal detectors of the probe equipment with the pad. Through the electric communication between probes on the probe card and the pad, it is tested whether the semiconductor integrated circuit device operates normally or not.

Conventionally, a cantilever-type probe card has a 4×8 chip array structure (32 DUT in parallel) to correspond to a chip array of an electronic component being tested.

Referring to FIGS. 1 to 3, a manufacturing process of the conventional normal probe card is illustrated in plan views.

Explaining the manufacturing process of the conventional probe card in brief, first, as shown in FIG. 1, bumps 11 are formed at a surface of a probe substrate 10 to correspond to pads arranged on a surface of an electronic component, chip, etc. being tested.

Then, as shown in FIG. 2, a 6-inch silicon wafer 20, having probe tips 21 and supporting beams 22 formed at a surface thereof, is prepared. Here, the bumps 11, probe tips 21, and supporting beams 22 are formed by photolithography and plating processes.

After preparing the probe substrate 10 and the silicon wafer 20, as shown in FIG. 3, a solder paste P is applied to an upper end of each bump 11. In succession, the silicon wafer 20 is placed on the probe substrate 10 so that an end of each supporting beam 22 comes into contact with the upper end of each bump 11, and is heated to a temperature of approximately 200 to 350 degree Celsius. Thereby, the bump 11 and the supporting beam 22 are attached to each other as the solder paste P is molten. Finally, by removing the silicon wafer 20 via etching, a probe bonding process, that is a key process in the manufacture of a probe card, is completed.

Nowadays, in tandem with development of semiconductor manufacture techniques, an increased number of chips are formed on a single substrate to reduce manufacturing costs and improve productivity. This consequently results in scale-up of a probe card used to test the chips.

FIGS. 4 to 6 are plan views illustrating a manufacturing process of a conventional large-scale probe card.

As shown in FIGS. 4 to 6, a large-scale probe substrate 30 having a 8×16 chip array structure (128 DUT in parallel) and a 12-inch silicon wafer 40 to correspond to the large-scale probe substrate 30 are used to manufacture the conventional large-scale probe card.

DISCLOSURE OF INVENTION

Technical Problem

However, the above described manufacturing process of the conventional probe card as shown in FIGS. 1 to 3 has the following problems.

Firstly, due to the fact that the probe substrate 10 and the silicon wafer 20 are heated to the high temperature of approximately 200 to 350 degree Celsius in order to affix the bumps 11 to the supporting beams 22, the material of the substrate 10 is mainly limited to ceramic based materials. This problematically increases the price of the probe card.

Secondly, when the substrate 10 and the silicon wafer 20 are subjected to thermal expansion and shrinkage upon their heating and cooling, contact regions between the bumps 11 and the supporting beams 22 may exhibit a positional error under a high temperature due to a difference between thermal expansion coefficients of both the silicon wafer 20 and the ceramic substrate 10. Moreover, a residual stress generated upon cooling tends to generate a shearing force at the contact regions, causing unintentional separation between the bumps 11 and the supporting beams 22.

Thirdly, the manufacturing process of the conventional probe card suffers from inferior compatibility of the silicon wafer when the size of the probe substrate varies. For example, when a 128-DUT probe substrate as shown in FIGS. 4 to 6 has to substitute for a 32-DUT probe substrate, correspondingly, a 6-inch silicon wafer must be substituted by a 12-inch silicon wafer. Seeing as the size of probe test equipment is gradually increasing, the compatibility problem of the conventional probe bonding process must be periodically generated.

Fourthly, when the large-scale silicon wafer is used, it increases generation probability of defective products, resulting in high manufacturing costs of products.

Technical Solution

Therefore, the present invention has been made in view of the above problems, and it is an object of the present invention to provide a silicon wafer for probe bonding and a probe bonding method using the same, which enable manufacture of a probe card at room temperature using a local laser scanning method, thereby permitting use of various materials of probe substrates to thereby reduce manufacturing costs of products, and minimizing damage to probes due to a residual stress generated upon thermal expansion and shrinkage.

It is another object of the present invention to provide a silicon wafer for probe bonding and a probe bonding method using the same, which can allow a constant size of silicon wafer to be used regardless of size variation of a probe substrate, resulting in high compatibility of the silicon wafer for probe bonding.

As is apparent from the above description, a silicon wafer for probe bonding and a probe bonding method using the same according to the present invention has the following advantageous effects.

Firstly, according to the present invention, a probe card can be manufactured at room temperature using a local laser scanning method. This has the effects of reducing manufacturing costs of the probe card because various materials of probe substrates can be used and minimizing damage to probes due to a residual stress generated upon thermal expansion and shrinkage.

Secondly, according to the present invention, even if the size of a probe substrate varies, a silicon wafer having a constant size can be used to perform probe bonding on the probe substrate. This results in high compatibility of the silicon wafer for probe bonding.

Thirdly, according to the present invention, a glass panel can be bonded to the surface of silicon wafer modules by means of epoxy adhesive, double sided tape, etc. The glass panel is effective to control the flatness of all the silicon wafer modules, and to prevent sagging or distortion of the silicon wafer due to thermal expansion and shrinkage generated when contact regions between bumps of the probe substrate and supporting beams of the silicon wafer are heated and cooled during the probe bonding process.

BRIEF DESCRIPTION OF THE DRAWINGS

The above and other objects, features and other advantages of the present invention will be more clearly understood from the following detailed description taken in conjunction with the accompanying drawings, in which:

FIGS. 1 to 3 are plan views illustrating a manufacturing process of a conventional normal probe card;

FIGS. 4 to 6 are plan views illustrating a manufacturing process of a conventional large-scale probe card;

FIG. 7 is a plan view illustrating a silicon wafer for probe bonding according to a first embodiment of the present invention;

FIG. 8 is a plan view illustrating a process of manufacturing a probe card using the silicon wafer of FIG. 7;

FIG. 9 is an enlarged plan view illustrating a silicon wafer for probe bonding according to a second embodiment of the present invention;

FIGS. 10 to 13 are side sectional views illustrating a process of manufacturing the silicon wafer for probe bonding according to the present invention;

FIGS. 14 and 15 are plan views illustrating a silicon wafer module for probe bonding according to a third embodiment of the present invention;

FIG. 16 is a plan view illustrating a probe bonding process using the silicon wafer according to the present invention;

FIG. 17 is a plan view illustrating a probe bonding process using the silicon wafer module according to the present invention;

FIG. 18 is a side sectional view illustrating a use example of the silicon wafer for probe bonding according to a fourth embodiment of the present invention; and FIG. 19 is a partially broken away enlarged side sectional view illustrating a probe bonding process using the silicon wafer of FIG. 18.

MODE FOR THE INVENTION

In accordance with a first aspect of the present invention, the above and other objects can be accomplished by the provision of a silicon wafer for probe bonding comprising probe tips formed at a first surface of the silicon wafer, and supporting beams each having a first end provided on each of the probe tips to have a predetermined arrangement pattern, further comprising: openings formed through the silicon wafer to expose a second end of the respective supporting beams opposite to the probe tips.

In accordance with a second aspect of the present invention, the above and other objects can be accomplished by the provision of a silicon wafer module for probe bonding formed by dividing a silicon wafer to have a predetermined shape, the silicon wafer comprising a plurality of probe tips formed at a first surface of the silicon wafer, and a plurality of supporting beams each having a first end that comes into contact with each of the probe tips to have a predetermined arrangement pattern, wherein the silicon wafer further comprises a plurality of openings formed through the silicon wafer to allow a second end of the respective supporting beams to protrude into the respective openings, wherein the second end of the respective supporting beams is exposed to the outside through the openings.

In accordance with a third aspect of the present invention, the above and other objects can be accomplished by the provision of a probe bonding method comprising the steps of: a) locating a silicon wafer for probe bonding on a probe substrate so that supporting beams of the silicon wafer, which are exposed to the outside through respective openings formed through the silicon wafer, come into contact with bumps formed at the probe substrate, respectively; b) scanning laser beams from an exterior source through the openings to bond the supporting beams to the bumps; and c) removing the silicon wafer for probe bonding by etching while retaining the probe tips and the supporting beams.

In accordance with a fourth aspect of the present invention, the above and other objects can be accomplished by the provision of a probe bonding method comprising the steps of: a) locating a silicon wafer module for probe bonding on a predetermined region of a probe substrate so that supporting beams of the silicon wafer module, which are exposed to the outside through respective openings formed through the silicon wafer module, come into contact with bumps formed on the probe substrate, respectively; b) combining one or more additional silicon wafer modules to be coupled to the silicon wafer module to thereby correspond to all the bumps on the probe substrate; c) scanning laser beams from an exterior source through the openings to bond the supporting beams to the bumps; and d) removing the silicon wafer modules for probe bonding by etching while retaining the probe tips and the supporting beams.

In accordance with a fifth aspect of the present invention, the above and other objects can be accomplished by the provision of a probe bonding method using a silicon wafer for probe bonding having a size smaller than a probe substrate, comprising the steps of: a) locating the silicon wafer for probe bonding on a predetermined region of the probe substrate so that supporting beams of the silicon wafer, which are exposed to the outside through respective openings formed through the silicon wafer, come into contact with bumps formed on the probe substrate, respectively; b) scanning laser beams from an exterior source through the openings to bond the supporting beams to the bumps; and c) removing the silicon wafer for probe bonding by etching while retaining the probe tips and the supporting beams; and d) repeatedly performing step a) to step c) in this sequence on the remaining portion of the probe substrate using one or more additional silicon wafers for probe bonding having the same shape as the silicon wafer.

Now, preferred embodiments of the present invention will be described in detail with reference to the accompanying drawings. Wherever possible, the same reference numerals will be used throughout drawings to refer to the same or like parts.

FIG. 7 is a plan view illustrating a silicon wafer for probe bonding according to a first embodiment of the present invention.

As shown in FIG. 7, the silicon wafer 140 for probe bonding according to the first embodiment of the present invention is formed at a surface thereof with probe tips 141 and supporting beams 142 via photolithography and plating processes. In the present embodiment, between two pairs of the supporting beams 142 arranged adjacent to each other is defined a first opening 143 so that the supporting beams 142 partially protrude into the first opening 143. Also, in a region where only one pair of the supporting beams 142 is arranged to form a unit lattice, a second opening 143' is defined between the two supporting beams 142 so that the supporting beams 142 partially protrude into the second opening 143'. Both the first and second openings 143 and 143' are penetrated through the silicon wafer 140 from an upper surface to a lower surface thereof. With this configuration, each of the supporting beams 142, that partially protrudes into the first or second opening 143 or 143' is exposed at the protruded end thereof to the outside via the opening 143 or 143'.

Meanwhile, referring to FIG. 7, four or two supporting beams 142, arranged adjacent to each other, are allotted to the first or second opening 143 and 143' but are not limited thereto. In the present invention, there is no restriction in the arrangement structure of the supporting beams 142 so long as one or more supporting beams 142 may be allotted to each opening.

FIG. 9 is an enlarged plan view illustrating a silicon wafer for probe bonding according to a second embodiment of the present invention.

As shown in FIG. 9, a plurality of horizontally elongated openings 143" may be formed in parallel to one another so that a predetermined number of supporting beams 142, arranged adjacent to one another, are allotted to each opening 143" and protrude into the opening 143". Alternatively, curved openings may be formed according to the arrangement structure of the supporting beams 142.

Here, the openings 143 are formed by coating a photoresist on the upper surface of the silicon wafer 140, attaching a mask, that is patterned with the openings 143, to the photoresist coated upper surface, and successively performing exposure and development of the mask.

Now, the formation of the openings will be explained in detail with reference to FIGS. 10 to 13.

FIGS. 10 to 13 are side sectional views illustrating a process of manufacturing the silicon wafer for probe bonding according to the present invention.

Firstly, as shown in FIG. 10, a photoresist 160 is applied to a surface of the silicon wafer 140, i.e. the upper surface of the silicone wafer 140, opposite to the supporting beams 142.

Secondly, as shown in FIG. 11, the photoresist 160 is partially removed as exposure and development processes are successively performed on predetermined portions of the photoresist 160, thereby obtaining an opening pattern 161.

Thirdly, as shown in FIG. 12, as the silicon wafer 140 is dry etched using the opening pattern 161, the openings 143 are formed.

Finally, as shown in FIG. 13, the photoresist 160 is completely removed from the surface of the silicon wafer 140 by making use of chemicals, such as acetone, selected depending on the material of the photoresist. Through the openings 143 formed by the above described process, one end of each supporting beam 142 is exposed to the outside.

Referring to FIG. 8, a process of manufacturing a probe card using the silicon wafer 140 for probe bonding is illustrated in plan view.

Firstly, the end of each supporting beam 142, that is exposed to the outside through the opening 143 formed at the silicon wafer 140, is positioned to come into contact with an upper end of each bump 131 formed at a substrate 130, and a laser beam 201 from a separate exterior laser source 200 is scanned to the contact region between the supporting beam 142 and the bump 131 through the opening 143. The laser beam 201 melts a solder paste P applied to the upper end of the bump 131, causing the supporting beam 142 to be bonded to the bump 131. After all the supporting beams 142 are bonded to the corresponding bumps 131 formed at the substrate 130, the silicon wafer 140 is removed by etching while retaining the probe tips 141 and the supporting beams 142. In this way, a probe card is completed.

With the probe bonding method using the silicon wafer for probe bonding and the laser beam according to the present invention, the attachment of both the bump and the supporting beam is achieved through localized heating. This enables the probe card to be manufactured at room temperature regardless of the material of the probe substrate, resulting in a reduction in the price of the substrate. Further, the probe bonding method of the present invention does not generate a residual stress due to thermal expansion and shrinkage, preventing damage to the resulting probes.

Meanwhile, the silicon wafer for probe bonding according to the present invention may be equally divided into four parts so that a defective quarter of the silicon wafer is cut, resulting in a silicon wafer module.

FIGS. 14 and 15 are plan views illustrating a silicon wafer module for probe bonding according to a third embodiment of the present invention.

Referring first to FIG. 14, when it is determined that a quarter 240a of a completed silicon wafer 240 for probe bonding involves a defective portion E, the quarter 240a is cut away from the silicon wafer 240.

Then, as shown in FIG. 15, only the remaining portion 240b of the silicon wafer 240 except for the defective quarter 240a is attached to a corresponding portion of a probe substrate 230. In this case, a silicon wafer module 340a, which is cut-away from another silicon wafer, is attached to the remaining portion of the probe substrate 240 that corresponds to the defective quarter 240a.

Modulation of a silicon wafer may be performed in such a fashion that the silicon wafer is divided into two semicircular parts instead of four equal parts. If necessary, furthermore, the circular silicon wafer may be unequally divided by a line offset from a center axis. Similarly, the probe bonding using the silicon wafer module of the present embodiment is performed by scanning a laser beam through each opening formed at the wafer.

With adaptation of the present invention as stated above, a conventional small-size silicon wafer for probe bonding may be used in spite of scale-up of a probe substrate. For example, referring to FIG. 16, a probe bonding process, using the silicon wafer smaller than the probe substrate, according to the present invention is illustrated in plan view.

With the probe bonding method of the prior art, a 6-inch silicon wafer having a size of 32 DUT in parallel is useless when a probe substrate 430 having a size of 128 DUT in parallel is used. However, when a 6-inch silicon wafer 440, formed with the openings 143 of FIG. 7 according to the present invention, can be bonded to a quarter of the probe substrate 430. That is, after the 6-inch silicon wafer 440 formed with the openings is attached to the quarter of the probe substrate 430, the above described probe bonding process using the laser beam is performed. Then, the wafer is removed by etching while retaining the probe tips and supporting beams thereof. By repeatedly performing this probe bonding process on the remaining respective quarters of the probe substrate 430, a probe card can be completed.

FIG. 17 is a plan view illustrating a probe bonding process using the silicon wafer module according to the present invention.

As shown in FIG. 17, alternatively, after four 6-inch silicon wafers having openings are prepared, they are arranged adjacent to each other to correspond to respective quarters of the probe substrate 430. In this case, overlapped adjacent portions of all the silicon wafers are cut away, thereby forming 6-inch silicon wafer modules 440a. Then, as the silicon wafer modules 440a are adjoined to one another to thereby be bonded to the probe substrate 430 using the laser beam. The probe bonding using the silicon wafer modules 440a may be successively performed on the respective quarters of the probe substrate 430, or may be simultaneously performed after the silicon wafer modules 440a are positioned at a predetermined height from the respective quarters of the probe substrate 430.

FIG. 18 is a side sectional view illustrating a silicon wafer for probe bonding according to a fourth embodiment of the present invention.

As shown in FIG. 18, a glass panel 170 may be attached to the surface of the silicon wafer 140 opposite to the supporting beams and probe tips thereof. The use of the glass panel 170 is effective to prevent sagging or distortion at the center of the silicon wafer 140 when the silicon wafer 140 is formed with the above described elongated openings 143" as shown in FIG. 9. That is, when the contact regions between the bumps and the supporting beans are heated and cooled by the laser beam, they are inevitably subjected to thermal expansion or shrinkage. This causes sagging or distortion of the silicon wafer due to the presence of the elongated openings 143". The glass panel 170 is able to effectively prevent the sagging or distortion of the silicon wafer 140.

Admittedly, the glass panel 170 may be attached to the combined silicon wafer modules 340a and 240b of FIG. 15 or the combined silicon wafer modules 440a of FIG. 17. In this case, the glass panel 170 also functions to keep the silicon wafer modules level.

In use, the glass panel 170 is bonded to the surface of the silicon wafer or silicon wafer modules by means of epoxy adhesive, double sided tape, etc. Referring to FIG. 19, a probe bonding process using the silicon wafer 140 provided with the glass panel 170 is illustrated in partially broken away enlarged side sectional view. In this case, the glass panel 170 permits penetration of the laser beam 210, having no effect on the bonding process.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A silicon wafer for probe bonding comprising probe tips formed at a first surface of the silicon wafer, and supporting beams each having a first end provided on each of the probe tips to have a predetermined arrangement pattern, further comprising:

openings formed through the silicon wafer to expose a second end of the respective supporting beams opposite to the probe tips.

2. The silicon wafer as set forth in claim 1, wherein each opening has a linear shape.

3. The silicon wafer as set forth in claim 1, wherein each opening has a curved shape.

4. The silicon wafer as set forth in any one of claims 1 to 3, further comprising:

a glass panel coupled to a second surface of the silicon wafer opposite to the supporting beams.

5. A silicon wafer module for probe bonding formed by dividing a silicon wafer to have a predetermined shape, the silicon wafer comprising a plurality of probe tips formed at a first surface of the silicon wafer, and a plurality of supporting beams each having a first end that comes into contact with each of the probe tips to have a predetermined arrangement pattern, wherein the silicon wafer further comprises a plurality of openings formed through the silicon wafer to allow a second end of the respective supporting beams to protrude into the respective openings, wherein the second end of the respective supporting beams is exposed to the outside through the openings.

6. The silicon wafer module as set forth in claim 5, wherein each of the plurality of the openings has an elongated linear shape extending in a horizontal direction of the silicon wafer module, and the plurality of the openings are arranged in parallel to one another.

7. The silicon wafer module as set forth in claim 5, wherein each of the plurality of openings has a curved shape.

8. The silicon wafer module as set forth in any one of claims 5 to 7, further comprising:

a glass panel coupled to a second surface of the silicon wafer module opposite to the supporting beams.

9. A probe bonding method comprising using a silicon wafer comprising probe tips formed at a first surface of the silicon wafer, supporting beams each having a first end provided on each of the probe tips to have a predetermined arrangement pattern and openings formed through the silicon wafer to expose a second end of the respective supporting beams opposite to the probe tips, the method further comprising the steps of:

a) locating the silicon wafer for probe bonding on a probe substrate so that the supporting beams of the silicon wafer, which are exposed to the outside through the respective openings formed through the silicon wafer, come into contact with bumps formed on the probe substrate, respectively;

b) scanning laser beams from an exterior source through the openings to bond the second ends of the supporting beams to the bumps; and c) removing the silicon wafer for probe bonding by etching while retaining the probe tips and the supporting beams.

10. A probe bonding method comprising using a silicon wafer module for probe bonding by dividing a silicon wafer to have a predetermined shape, the silicon wafer includes a plurality of probe tips formed at a first surface of the silicon wafer, a plurality of supporting beams each having a first end that comes into contact with each of the probe tips to have a predetermined arrangement pattern and a plurality of openings formed through the silicon wafer to allow a second end of the respective supporting beams to protrude into the respective openings, the second end of the respective supporting beams is exposed to the outside through the openings, the method further comprising the steps of:

a) locating the silicon wafer module for probe bonding on a predetermined region of a probe substrate so that the second ends of the supporting beams of the silicon wafer module, which are exposed to the outside through the respective openings formed through the silicon wafer module, come into contact with bumps formed on the probe substrate, respectively;

b) combining one or more additional silicon wafer modules having the same shape as the silicon wafer module to be coupled to the silicon wafer module to thereby correspond to all the bumps on the probe substrate;

c) scanning laser beams from an exterior source through the openings to bond the second ends of the supporting beams to the bumps; and d) removing the silicon wafer modules for probe bonding by etching while retaining the probe tips and the supporting beams.

11. The method as set forth in claim 10, further comprising, between step b) and step c), the step of: e) coupling a glass panel to the combined silicon wafer modules.

12. A probe bonding method comprising using a silicon wafer comprising probe tips formed at a first surface of the silicon wafer, supporting beams each having a first end provided on each of the probe tips to have a predetermined arrangement pattern and openings formed through the silicon wafer to expose a second end of the respective supporting beams opposite to the probe tips, the silicon wafer has a size smaller than a probe substrate, the method further comprising the steps of:

a) locating the silicon wafer for probe bonding on a predetermined region of the probe substrate so that the second ends of the supporting beams of the silicon wafer, which are exposed to the outside through the respective openings formed through the silicon wafer, come into contact with bumps formed on the probe substrate, respectively;

b) scanning laser beams from an exterior source through the openings to bond the second ends of the supporting beams to the bumps; and c) removing the silicon wafer for probe bonding by etching while retaining the probe tips and the supporting beams; and d) repeatedly performing step a) to step c) in this sequence on the remaining portion of the probe substrate using one or more additional silicon wafers for probe bonding having the same shape as the silicon wafer.

\* \* \* \* \*